(12) United States Patent
Pourchet et al.

(10) Patent No.: US 10,020,212 B1
(45) Date of Patent: Jul. 10, 2018

(54) MICRO-LED PICK AND PLACE USING METALLIC GALLIUM

(71) Applicant: Oculus VR, LLC, Menlo Park, CA (US)

(72) Inventors: Allan Pourchet, Cork (IE); Pooya Saketi, Cork (IE)

(73) Assignee: Oculus VR, LLC, Menlo Park, CA (US)

( * ) Notice: Subject to any disclaimer, the term of this patent is extended or adjusted under 35 U.S.C. 154(b) by 0 days.

(21) Appl. No.: 15/728,174

(22) Filed: Oct. 9, 2017

(51) Int. Cl.
| | |
|---|---|
| *H01L 21/67* | (2006.01) |
| *H01L 25/075* | (2006.01) |
| *H01L 25/16* | (2006.01) |
| *H01L 33/00* | (2010.01) |
| *H01L 33/32* | (2010.01) |
| *H01L 33/30* | (2010.01) |

(52) U.S. Cl.
CPC .... *H01L 21/67144* (2013.01); *H01L 25/0753* (2013.01); *H01L 25/167* (2013.01); *H01L 33/0079* (2013.01); *H01L 33/30* (2013.01); *H01L 33/32* (2013.01)

(58) Field of Classification Search
CPC .......................... H01L 25/073; H01L 21/67144
See application file for complete search history.

(56) References Cited

U.S. PATENT DOCUMENTS

| | | | |
|---|---|---|---|
| 2017/0142874 A1* | 5/2017 | Pourchet | ............. H01L 21/6836 |
| 2018/0040764 A1* | 2/2018 | Henley | ............... H01L 33/0079 |

* cited by examiner

*Primary Examiner* — Mounir Amer
(74) *Attorney, Agent, or Firm* — Fenwick & West LLP

(57) ABSTRACT

An LED die containing a gallium semiconductor layer is placed on a target substrate using a pick-up tool (PUT) attached to the LED die using metallic gallium. As a result of a laser lift-of (LLO) process to separate the gallium semiconductor layer from a substrate layer on which the gallium semiconductor layer is formed, a layer of gallium metal is formed on a surface of the LED die. The gallium layer is melted to form liquid gallium. A head of the PUT is contacted with the liquid gallium, whereupon the LED die is cooled such that the liquid gallium solidifies, attaching the LED die to the PUT. The PUT picks up and places the LED die at a desired location on a target substrate. The LED die can be heated to melt the gallium layer, allowing the PUT to be detached.

12 Claims, 11 Drawing Sheets

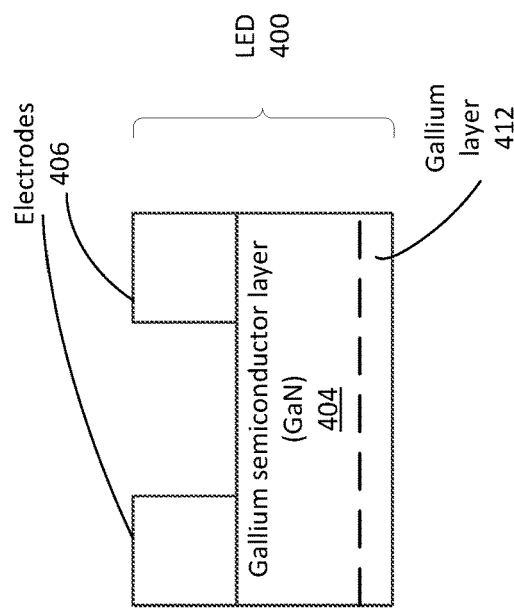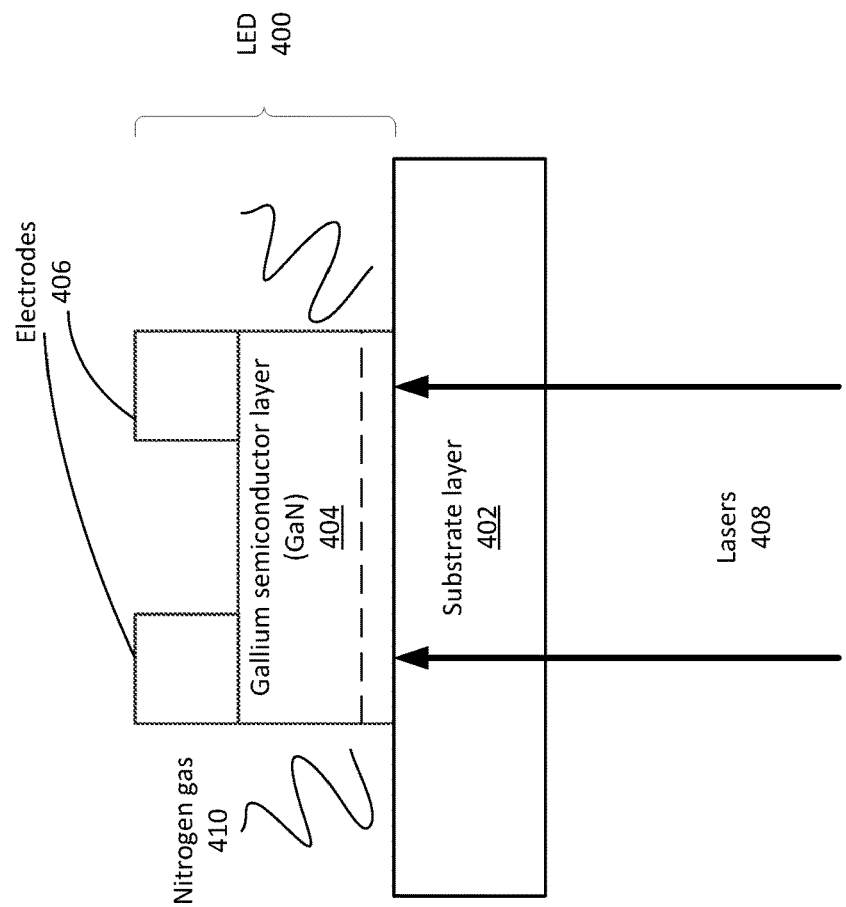

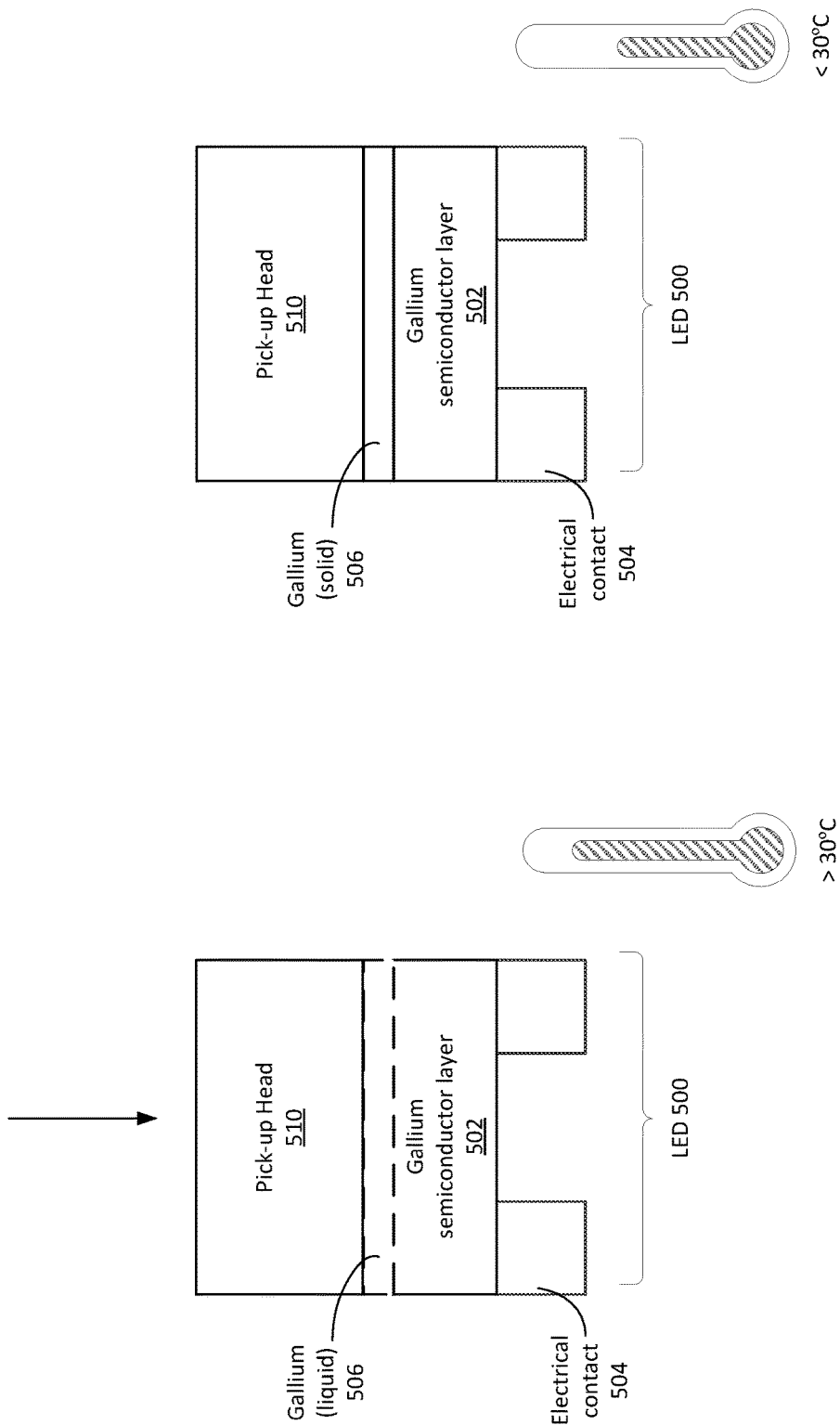

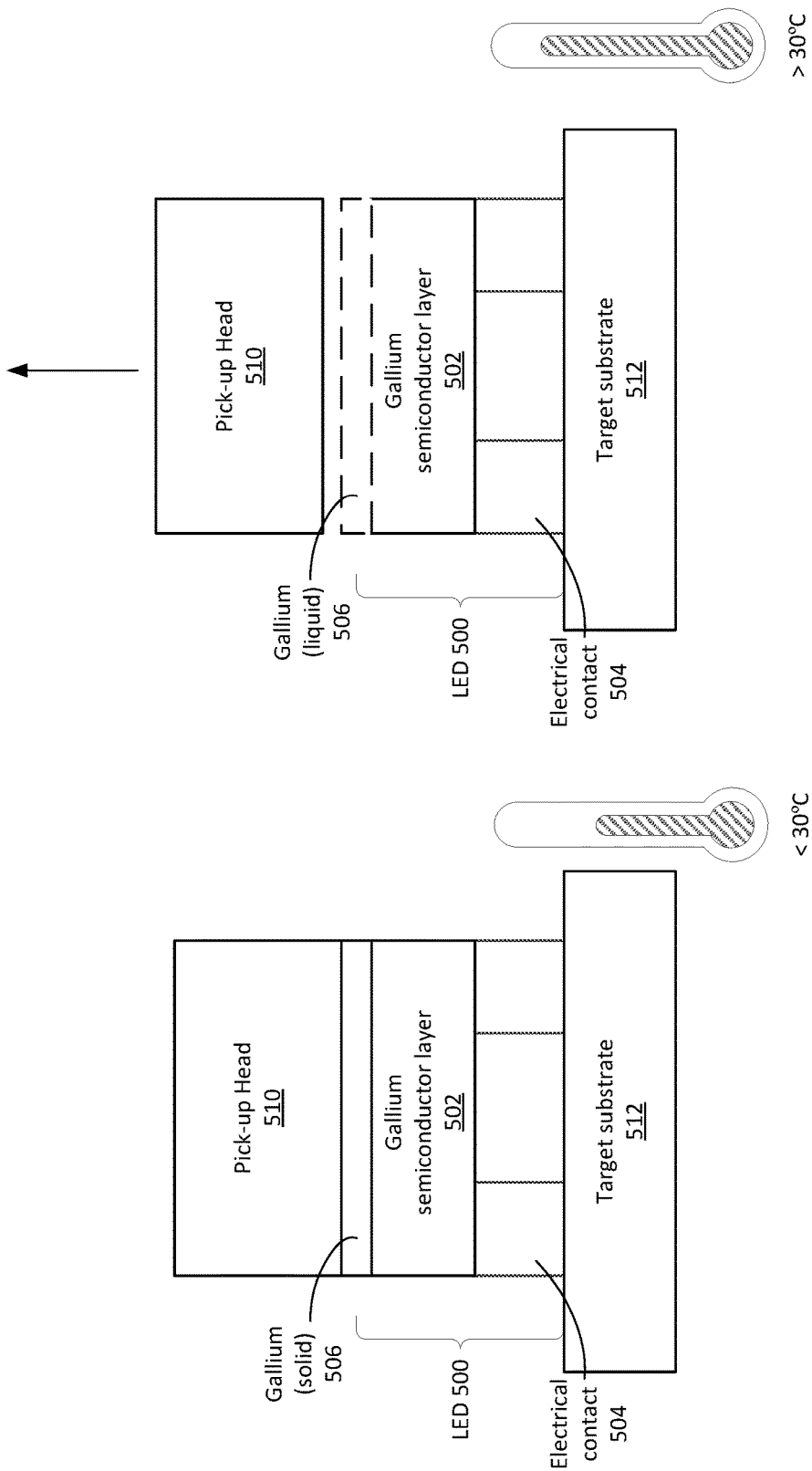

MICRO-LED PICK AND PLACE USING METALLIC GALLIUM

BACKGROUND

The present disclosure relates to an assembly process for use in, but not exclusively limited to, pick and place of very small display element(s) that need to be transferred from an initial substrate to a receiving substrate using a pick-up and transfer process.

To populate a display with very small light emitting diodes (LEDs), such as micro-LEDs, there may be a need to transfer the LEDs from the native substrate on which they have been manufactured to a target substrate that forms part of a display, or "display substrate." Such small semiconductor devices may be assembled with a defined separation distance between them or closely packed together on the target substrate. Because of the small size of these devices (e.g., smaller than 49×40 $\mu m^2$), conventional pick and place techniques are unsuitable.

SUMMARY

Embodiments relate to placing semiconductor devices such as LEDs on a target substrate using a pick-up tool (PUT). An array of LED dies is formed including a substrate layer and a gallium semiconductor layer. The gallium semiconductor layer may be a gallium arsenide (GaAs) or gallium nitride (GaN) epitaxial layer formed (e.g., grown) on a substrate layer, such as a sapphire, GaAs or glass substrate. The substrate may be substantially transparent to a laser used for a laser lift-off (LLO) process. During the LLO process, the laser is applied (e.g., through the substrate layer) to the gallium semiconductor layer to detach the gallium semiconductor layer of the LED dies from the substrate layer, such that a surface of the gallium semiconductor layer is exposed and provides a light emitting surface of the LED die. The surface includes gallium material that results from the LLO process where the laser is absorbed by a portion of the gallium semiconductor layer and converted into the gallium material. This gallium material may be heated to melt the gallium material and form liquid gallium on the surface of the gallium semiconductor layer. A head of a pick-up tool (PUT) is contacted with the liquid gallium, whereupon the LED die is cooled such that the liquid gallium solidifies, attaching the LED die to the PUT. The PUT picks up and places the LED die at a desired location on a target substrate.

The LED die can be heated to melt the gallium layer bonding the LED die to the PUT, allowing the PUT to be detached from the LED die. The gallium layer may then be used for subsequent pick and place operations, or be removed from the surface of the LED die. As such, the LED die can be picked and placed using the gallium layer that is naturally formed as a consequence of the LLO process, without the need for additional fluidic or adhesive materials for attaching to the PUT. In addition, due to the low melting point of gallium, the gallium layer can be melted into a liquid and re-cooled into a solid with minimal risk of damaging the LED die or PUT due to exposure to high temperatures.

In some embodiments, a method for picking and placing LED dies is provided. The method comprises forming an array of light emitting diode (LED) dies including a substrate layer and a gallium semiconductor layer. The method further comprises applying a laser to the gallium semiconductor layer to detach the substrate layer and the gallium semiconductor layer. The laser is absorbed by a portion of the gallium semiconductor layer to form gallium material on each of the LED dies of the array. The method further comprises separating the substrate layer from the gallium semiconductor layer to expose a surface of the gallium semiconductor layer and the gallium material on the surface. The gallium material on at least a subset of the LED dies is heated to form liquid gallium on the surface of the gallium semiconductor layer of the at least a subset of the LED dies. The method further comprises contacting the liquid gallium of the at least a subset of the LED dies with a pick-up tool (PUT), cooling the liquid gallium into solid gallium to attach the PUT with the at least a subset of the LED dies via the solid gallium, and picking up the at least a subset of the LED dies using the PUT.

BRIEF DESCRIPTION OF THE DRAWINGS

FIG. 4A illustrates a diagram of a laser lift-off operation that may be performed to separate a μLED from a substrate layer, in accordance with some embodiments.

FIG. 4B illustrates the μLED after it has been detached from the carrier substrate, in accordance with some embodiments.

FIGS. 5A-5G illustrate diagrams of a process for picking and placing an μLED using metallic gallium, in accordance with some embodiments.

The figures depict embodiments of the present disclosure for purposes of illustration only.

DETAILED DESCRIPTION

Embodiments relate to the picking and placing of semiconductor devices, such as light emitting diodes (LEDs), using gallium material that is formed on the LEDs during the manufacturing of the LEDs. LEDs may be manufactured by forming, among other things, a gallium semiconductor layer on a substrate layer (e.g., a glass or sapphire substrate). For example, in some embodiments, red LEDs may be manufactured by growing a gallium arsenide (GaAs) epitaxial layer on a substrate layer, while blue or green LEDs may be manufactured forming a gallium nitride (GaN) epitaxial layer on a substrate layer.

To manufacture a display using the LEDs, the LEDs picked up from a carrier substrate and placed onto a target substrate that forms part of a display, or "display substrate." A pick-up tool is used to pick one or more LEDs on the carrier substrate and place the LEDs onto the display substrate. In some embodiments, the display substrate may also be referred to as a device substrate.

When separating the from the substrate layer (e.g., using a laser lift-off, or LLO, technique), a gallium layer may be formed on a surface of the gallium semiconductor layer of the LED. This gallium layer is typically undesirable and is removed prior to operation of the LEDs on the display substrate.

In some embodiments, taking advantage of the low melting point of gallium (about 30° C.), the gallium layer that is naturally formed on the surface of the gallium semiconductor layer of the LED can be used to attach and detach the LED from the pick-up head of the pick-up tool for transferring the LED to the display substrate. This may allow the picking and placing of the LEDs without the need to apply a layer of interfacing material to the gallium semiconductor layer of the LEDs, thus improving the process of picking and placing the LEDs, such as from the carrier substrate where the LEDs are located for selective transfer onto the display substrate.

System for LED Display Fabrication

Figure 1:
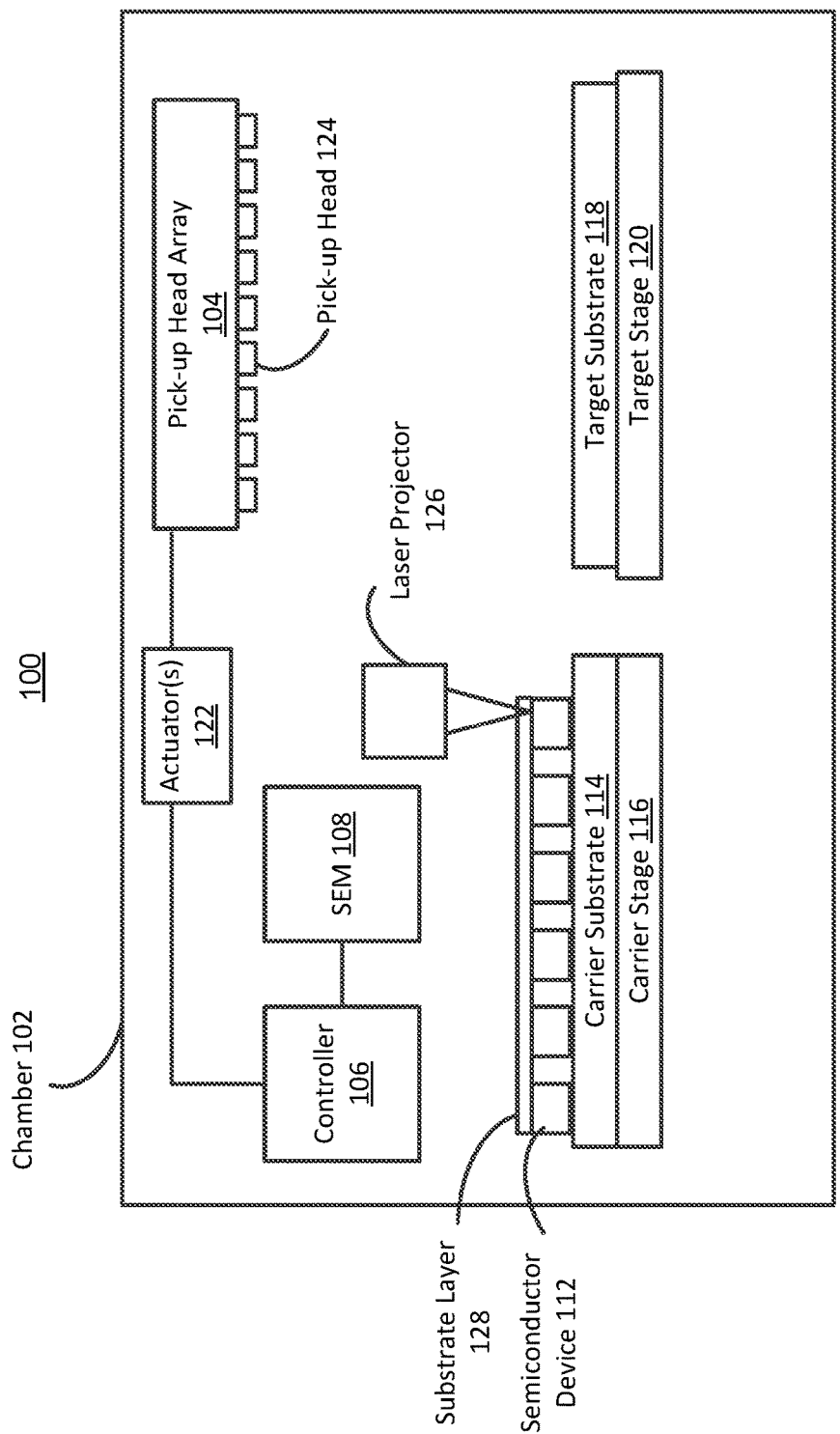
FIG. 1 is schematic diagram illustrating a display fabrication system, in accordance with one embodiment.

FIG. 1 is a block diagram illustrating a display fabrication system 100, in accordance one embodiment. The system 100 fabricates a display device by assembling semiconductor devices 112 from a carrier substrate 114 to a target substrate 118. In some embodiments, the semiconductor devices 112 are different color light emitting diode (LED) dies. The carrier substrate 114 may be a carrier film that holds the semiconductor devices 112 for pick up by the pick-up head array.

The target substrate 118 may be a display substrate, or may be an intermediate carrier substrate that facilitates bonding with a display substrate. The system 100 places LEDs at pixel locations of the display substrate, and bonds the LEDs to the display substrate. In some embodiments, the semiconductor devices 112 are micro-LEDs having a reduced divergence of light output and small light emitting area is comparison to conventional LEDs.

The system 100 may include, among other components, a scanning electron microscope (SEMS) chamber 102 defining an interior environment for picking and placing semiconductor devices 112 within the SEM chamber 102. The system 100 further includes a pick-up head array 104, a scanning electron microscope (SEM) 108, an actuator 122, a carrier stage 116, a target stage 120, and a laser projector 126, within the SEM chamber 102. The carrier stage 116 holds a carrier substrate 114 having semiconductor devices 112. The target stage 120 holds a target substrate 118 to receive some or all of the semiconductor devices 112 from the carrier substrate 114. A controller 106 is coupled to the SEM 108 and the pick-up head array 104 (e.g., via the actuator 122) and controls the operations of the SEM 108 and pick-up head array 104. For example, the controller 106 causes the pick-up head array 104 to pick up one or more semiconductor devices 112 located on a carrier substrate 114, and place the one or more semiconductor devices on the target substrate 118.

The pick-up head array 104 includes a plurality of pick-up heads 124. Each pick-up head 124 can pick up a semiconductor device 112 from the carrier substrate 114, and place the semiconductor device on the target substrate 118. After picking up a semiconductor device 112, the pick-up head 124 is aligned with a location on the target substrate 118. The pick-up head 124 is then separated from the semiconductor device 112 after placing the semiconductor device 112 at the location on the target substrate 118.

The actuator 122 is an electro-mechanical component that controls the movement of the pick-up head array 104 based on instructions from the controller 106. For example, the actuator 122 may move the pick-up head array 104, or individual pick-up heads 124, with three degrees of freedom including up and down, left and right, and forward and back. The actuator 122 may be embodied, for example, as a rotating motor, a linear motor or a hydraulic cylinder.

The SEM 108 facilitates a visual alignment for semiconductor device pick-up from the carrier substrate 114, and alignment for semiconductor device placement on the target substrate 118. For example, the SEM 108 generates images of the pick-up head array 104 and the carrier substrate 114, and provides the images to the controller 106. The controller 106 aligns the one or more pick-up heads 124 of the pick-up head array 104 with the carrier substrate 114 based on the images, and picks up one or more semiconductor devices 112 mounted on the carrier substrate 114. In another example, the SEM 108 generates images of the one or more pick-up heads 124 of the pick-up head array 104 and the target substrate 118, and provides the images to the controller 106. The controller 106 aligns the one or more pick-up heads 124 with the display substrate 118 based on the images, and places the semiconductor devices 112 attached to the one or more pick-up heads 124 on the display substrate 118.

In some embodiments, the SEM 108 is an environmental scanning electron microscope (ESEM) to provide images without specimen coating. The SEM chamber 102 is an ESEM chamber including a high pressure atmosphere of water vapor. The use of an SEM is advantageous for picking and place small semiconductor device, such as micro-LED dies. In various embodiments, other types of imaging devices may be used to facilitate the alignments.

In some embodiments, the carrier stage 116 and/or target stage 120 may be adjusted to facilitate precision alignment with the pick-up head array 104. For example, the carrier stage 116 and/or target stage 120 may include three degrees of freedom. The degrees of freedom may include left and right, backward and forward, and a yaw rotational degree of freedom. The carrier substrate 114 is moved with the carrier stage 116, and the display substrate 118 is moved with the target stage 120.

The system 100 may include one or more carrier substrates 114. For example, different carrier substrates 114 may carry different color LED dies. A carrier substrate 114 may be carrier film that holds singulated semiconductor devices 112 for transfer to the display substrate 118. The system may include one or more target substrates 118. In some embodiments, such as when the target substrate 118 is the display substrate for receiving the semiconductor devices 112, the target stage 120 includes a heater for thermal conductive bonding of the electrical contact pads of the semiconductor devices 112 to the display substrate 118 subsequent to placement of the semiconductor devices 112 on the display substrate 118 by the pick-up head 104. In other embodiments, the target substrate 118 is an intermediate carrier substrate that is used to facilitate direct bonding of the semiconductor devices 112 with a separate display substrate 118 (e.g., using a direct bonding process).

In some embodiments, the system 100 includes multiple pick-up head arrays 104 each positioned at a separate station. Each station may be dedicated to the pick and place of a particular color LED, such as a green station for green LEDs, a red station for red LEDs, and a blue station for blue LEDs, etc.

As discussed above, in some embodiments, the semiconductor devices 112 may correspond to microLEDs, or μLEDs. A μLED as described herein refers to a particular type of LED having a small active light emitting area (e.g., less than 2,000 $\mu m^2$), and collimated light output. The collimated light output increases the brightness level of light emitted from the small active light emitting area and prevents the spreading of emitted light into the beampath of invisible light used by light detectors and non-visible LEDs adjacent to the μLED. While the application discusses primarily μLEDs, it is understood that in other embodiments, the semiconductor devices 112 may comprise any semiconductor device having a gallium epitaxial layer.

Each of the semiconductor devices 112 may be formed on a substrate layer 128. The substrate layer 128 may be a transparent substrate, such as a glass substrate or a sapphire substrate. In some embodiments, the substrate layer 128 is formed of a material that is not optically transparent, such as gallium arsenide (GaAs), but is substantially transparent to a different wavelength range (e.g., IR range). In some embodiments, the semiconductor devices 112 are formed on the substrate layer 128 by growing a gallium semiconductor layer on the substrate layer 128. Here, the gallium semiconductor layer is an epitaxial layer on the substrate layer 128. In some embodiments, the semiconductor devices 112 are placed onto the carrier substrate 114 where they are held to facilitate detaching the substrate layer 128 from the semiconductor devices 112.

The laser projector 126 is used to detach the substrate layer 128 from the semiconductor devices 112, by exposing a surface of the semiconductor devices 112 adjacent to the substrate layer 128 to the laser projector 126. In some embodiments, the laser projector 126 is configured to project a laser that is able to pass through the substrate layer 128 and be absorbed by the gallium semiconductor layer of the semiconductor devices 112. For example, the laser projector 126 may project a pulse ultraviolet laser that is able to pass through a sapphire substrate layer 128 to be absorbed by the gallium semiconductor layer of the semiconductor devices 112. In other embodiments, where the substrate layer 128 comprises gallium arsenide, the laser projector 126 projects an IR laser. Absorption of the laser beam projected by the laser projector 126 causes a portion of the gallium semiconductor layer to separate into its component elements and weakens the bond between the gallium semiconductor layer of the semiconductor devices 112 and the substrate layer 128, allowing for the semiconductor devices 112 and the substrate layer 128 to be separated.

In some embodiments, the laser projector 126, instead of being configured to project a laser through the substrate layer 128, projects the laser at a junction of the substrate layer 128 and the gallium semiconductor layer of the semiconductor devices 112. As such, the projected laser may not need to pass through the substrate layer 128. In these cases, the substrate layer 128 may comprise a material not substantially transparent to the laser projected by the laser projector 126.

In some embodiments, another laser (not shown) generates a laser beam to singulate the semiconductor devices 112 on the carrier substrate 114. Multiple semiconductor devices 112 may be fabricated on a native substrate (e.g., the substrate layer 128) and singulated on the carrier substrate 114. In some embodiments, the laser beam is directed through the carrier substrate 114. The carrier substrate may include a carrier tape or other adhesive layer to hold the semiconductor devices 112 in place with an adhesion force. In some embodiments, the laser beam reduces the adhesion force to facilitate pick up of the semiconductor devices 112 by the pick-up head array 104. In some embodiments, the system 100 includes a mechanical dicer to singulate the semiconductor devices 112, such as a diamond based cutting wheel.

In some embodiments, the controller 106, in addition to controlling an alignment of the pick-up heads 124 of the pick-up head array 104 (e.g., using actuators 122), may also control a temperature of the chamber 102. In some embodiments, the controller 106 may alter the temperature of the chamber 102 to change a temperature of the semiconductor devices 112. For example, the controller 106 may operate one or more heating coils (not shown) in the chamber 102 to raise a temperature of the semiconductor devices 112. In other embodiments, the carrier stage 116 or other component may contain a heater able to directly heat one or more of the semiconductor devices 112. In some embodiments, the temperature of the chamber 102 may be controller using a separate temperature controller (not shown).

MicroLED Structure

Figure 2A:
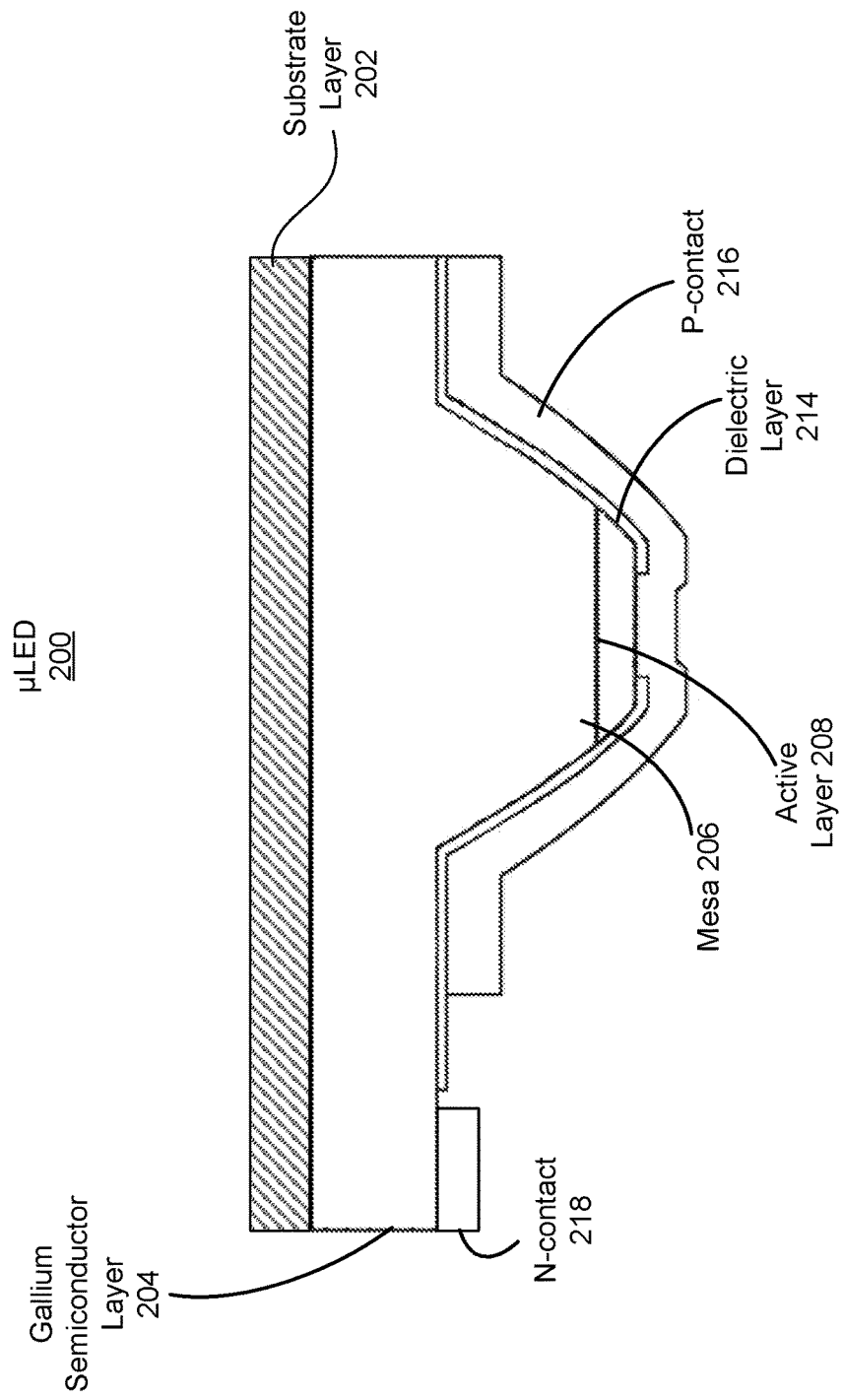
FIGS. 2A-2C shows schematic cross sections of a micro LED (μLED), in accordance with one embodiment.
Figure 2B:
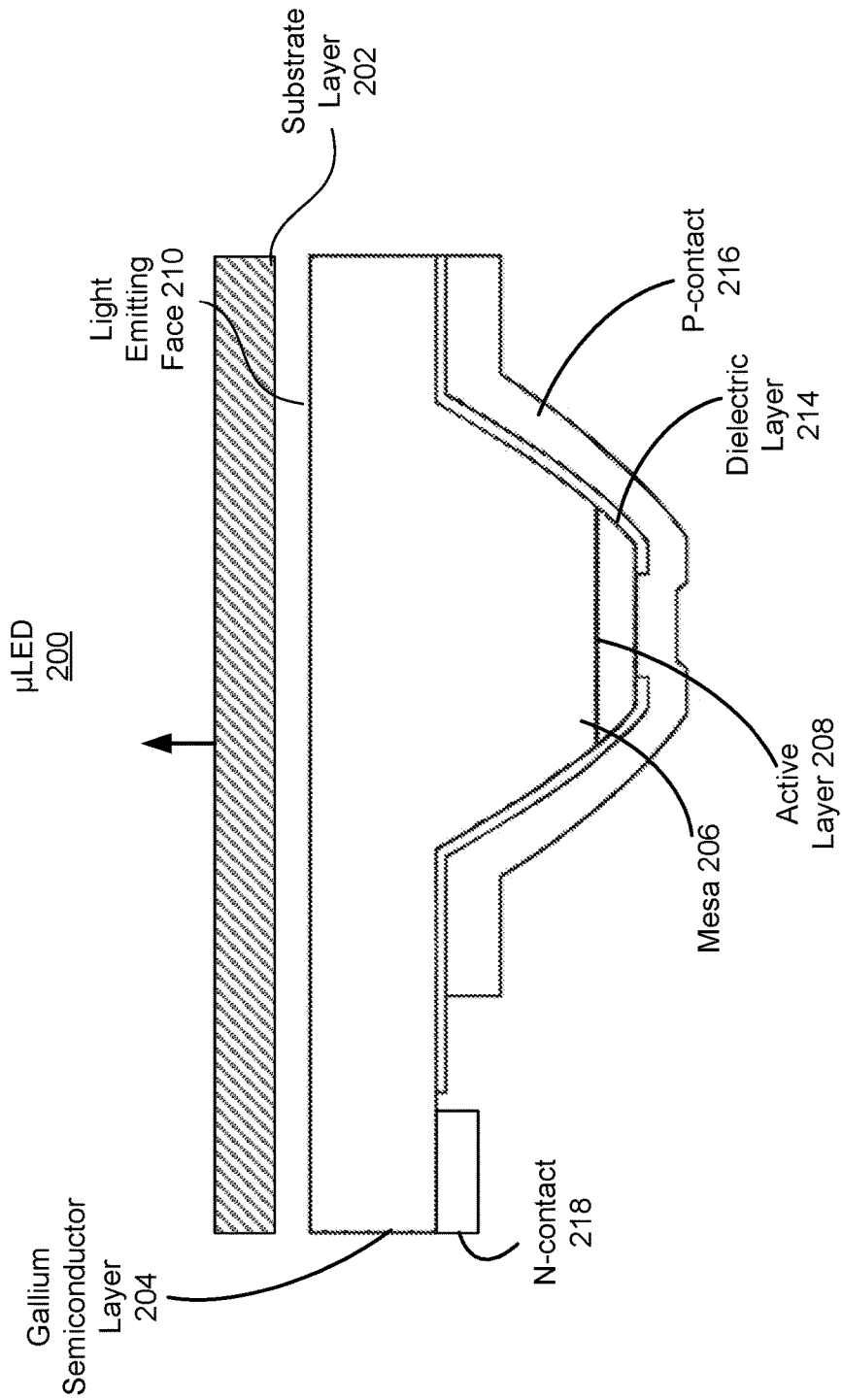
Figure 2C:
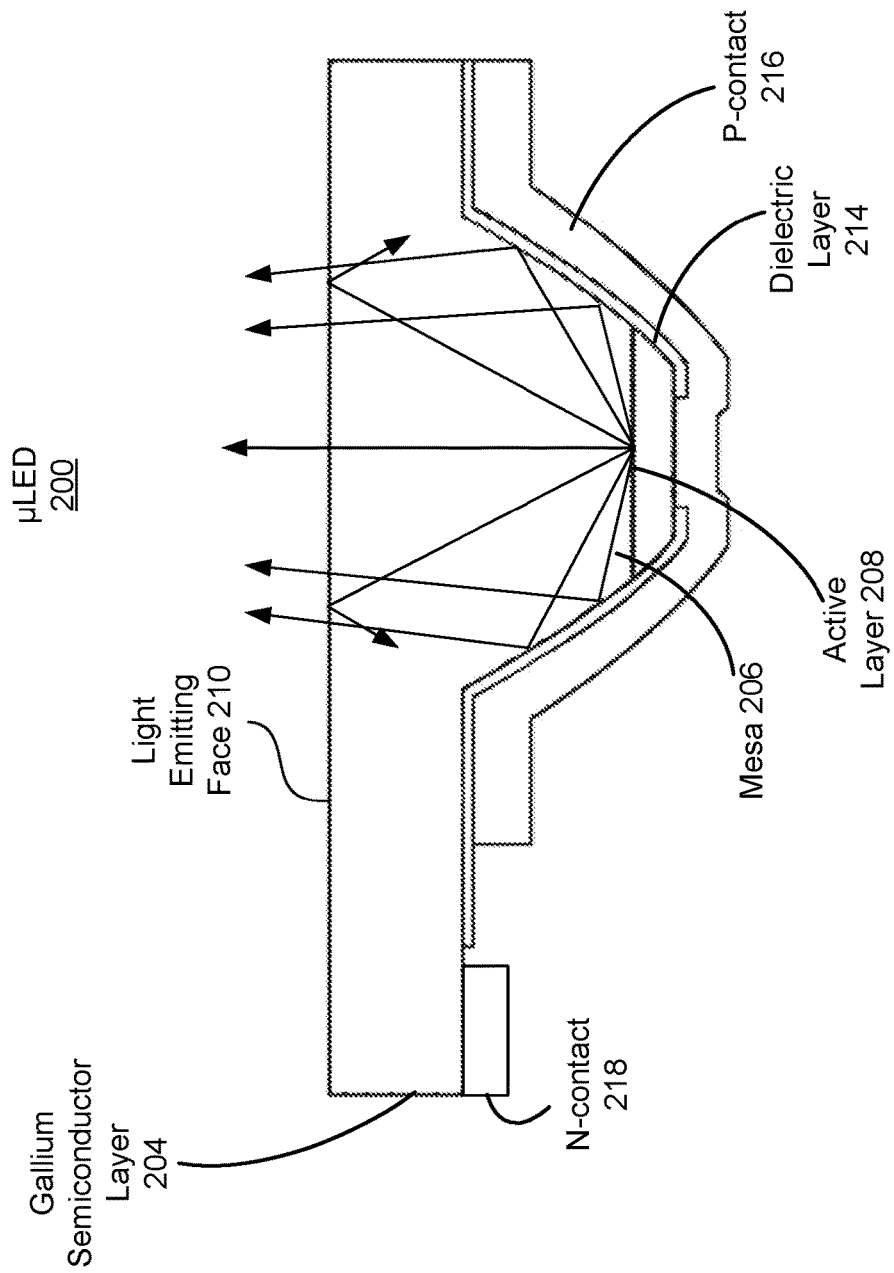

FIGS. 2A-2C show schematic cross sections of a µLED 200, in accordance with one embodiment. The µLED 200 is an example of a visible or non-visible LED that may be positioned on a surface of a display substrate (e.g., target substrate 118) to emit collimated visible or invisible light.

The µLED 200 may be formed on a substrate layer 202 (which may correspond to the substrate layer 128 illustrated in FIG. 1), and include, among other components, a gallium semiconductor layer 204 disposed on the substrate layer 202, a dielectric layer 214 disposed on the gallium semiconductor layer 204, a p-contact 216 disposed on a first portion of the dielectric layer 214, and an n-contact 218 disposed on a second portion of the gallium semiconductor layer 204. In some embodiments, the gallium semiconductor layer 204 is grown on the substrate layer 202 as an epitaxial layer.

As illustrated in FIG. 2B, the substrate layer 202 may be removed from the surface of the gallium semiconductor layer 204 of the µLED 200 to reveal a light emitting face 210 of the µLED 200. In some embodiments, the substrate layer 202 is separated from the gallium semiconductor layer 204 using a laser lift-off (LLO) process.

In some embodiments, the gallium semiconductor layer 204 is shaped into a mesa 206. An active (or light emitting) layer 208 (or "active light emitting area") is included in the structure of the mesa 206. The mesa 206 has a truncated top, on a side opposed to the light transmitting or emitting face 210 of the µLED 200. The mesa 206 also has a near-parabolic shape to form a reflective enclosure for light generated within the µLED 200.

FIG. 2C illustrates the µLED 200 after removal of the substrate layer 202. Upon removal of the substrate layer 202, the µLED 200 may be placed on a display substrate (not shown), and operated to emit light. The arrows 212 show how light emitted from the active layer 208 is reflected off the p-contact 216 and internal walls of the mesa 206 toward the light emitting face 210 at an angle sufficient for the light to escape the µLED device 200 (i.e., within an angle of total internal reflection). During operation, the p-contact 216 and the n-contact 218 connect the µLED 200 to a display substrate (not shown).

In some embodiments, the parabolic shaped structure of the µLED 200 results in an increase in the extraction efficiency of the µLED 200 into low illumination angles when compared to unshaped or standard LEDs. For example, standard LED dies generally provide an emission full width half maximum (FWHM) angle of 120°, which is dictated by the Lambertian reflectance from a diffuse surface. In comparison, the µLED 200 can be designed to provide controlled emission angle FWHM of less than standard LED dies, such as around 60°. This increased efficiency and collimated output of the µLED 200 can produce light visible to the human eye with only nano-amps of drive current.

The µLED 200 may include an active light emitting area that is less than standard ILEDs, such as less than 2,000 µm². The µLED 200 directionalizes the light output from the active light emitting area and increases the brightness level of the light output. The µLED 200 may be less than 20 µm in diameter with a parabolic structure (or a similar structure) etched directly onto the LED die during the wafer processing steps to form a quasi-collimated light beam emerging from the light emitting face 210 of the µLED 200.

As used herein, "directionalized light" includes collimated and quasi-collimated light. For example, directionalized light may be light that is emitted from a light generating region of a LED and at least a portion of the emitted light is directed into a beam having a half angle. This may increase the brightness of the LED in the direction of the beam of light.

A µLED 200 may include a circular cross section when cut along a horizontal plane as shown in FIGS. 2A-2C. A µLED 200 may have a parabolic structure etched directly onto the LED die during the wafer processing steps. The parabolic structure may comprise a light emitting region of the µLED 200 and reflects a portion of the generated light to form the quasi-collimated light beam emitted from the light emitting face 210.

As discussed above, the substrate layer 202 may correspond to a glass or sapphire substrate. The gallium semiconductor layer 204 may include a p-doped GaN layer, an n-doped GaN layer, and the active layer 208 between the p-doped and n-doped GaN layers. The active layer may include a multi-quantum well structure. The substrate layer 202 is transparent to a laser projected by the laser projector 126, which may be applied through the substrate layer 202 to the gallium semiconductor layer 204. In other embodiments, the substrate layer 202 may comprise a gallium compound, as such GaAs. The gallium semiconductor layer 204 may include a p-doped GaAn layer, an n-doped GaAs layer, and the active layer 208 between the p-doped and n-doped GaAs layers. In some embodiments, the µLED 200 includes a Gallium phosphide (GaP) substrate 202 for increased transparency relative to GaAs, such as for red visible LEDs. In some embodiments, the substrate layer 202 is a semiconductor substrate, such as a silicon substrate. When a non-transparent substrate layer 202 is used, the laser from the laser projector 126 may be applied at the interface of the substrate layer 202 and the gallium semiconductor layer to separate the layers and form the gallium material to facilitate pick and place.

Figure 3:
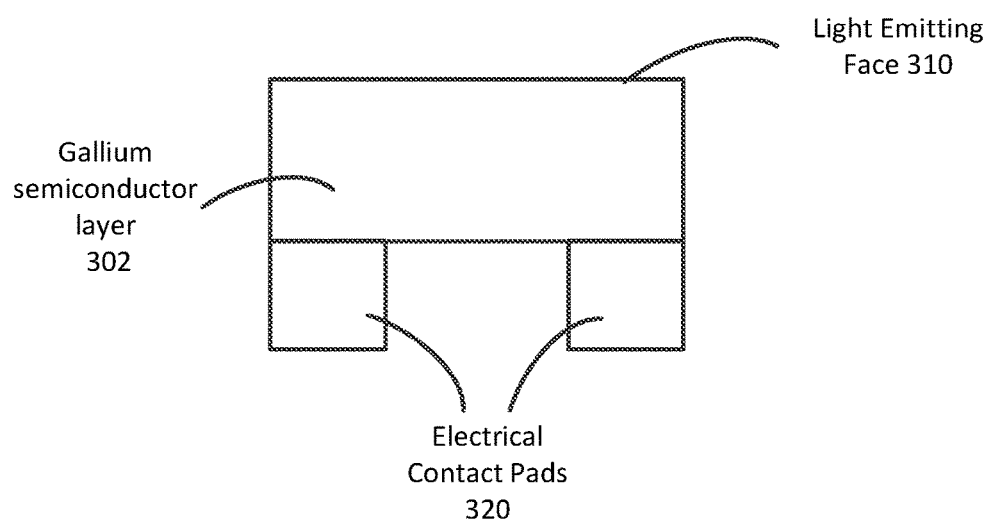
FIG. 3 illustrates a simplified schematic diagram of the μLED, in accordance with some embodiments.

FIG. 3 illustrates a simplified schematic diagram of a µLED 300, in accordance with some embodiments. The µLED 300 may correspond to the µLED 200 illustrated in FIGS. 2A-2C. The µLED 300 as illustrated in FIG. 3 comprises a gallium semiconductor layer 302 having a light emitting face 310. In addition, the µLED 300 comprises a pair of electrical contact pads 320, which may correspond to the N-contact 218 and the P-contact 216 illustrated in FIGS. 2A-2C.

Gallium Layer Formation

FIG. 4A illustrates a diagram of a laser lift-off operation that may be performed to separate a µLED from a substrate layer, in accordance with some embodiments. As illustrated in FIG. 4A, the µLED 400 is formed on the substrate layer 402. The substrate layer 402 may correspond to the substrate layer 128 illustrated in FIG. 1 or the substrate layer 202 illustrates in FIGS. 2A and 2B. In some embodiments, the substrate layer 402 is a glass or a sapphire substrate layer.

In some embodiments, the gallium semiconductor layer 404 of the µLED 400 comprises a gallium semiconductor compound, such as gallium nitride (GaN). In other embodiments, the gallium semiconductor layer 404 may comprise a different gallium semiconductor compound, such as gallium arsenide (GaAs) or gallium phosphide (GaP). In some embodiments, the type of gallium compound forming the substrate of the µLED 400 is based upon the type of µLED. The µLED 400 may further comprises a pair of electrodes 406 formed on a surface of the Gallium semiconductor 404 opposite from the substrate layer 402. The electrodes 406 may correspond to the electrical contact pads 320 illustrated in FIG. 3 and/or the p-contact 216 and the n-contact 218 illustrated in FIGS. 2A-2C.

A laser lift-off (LLO) procedure may be used to separate the µLED 400 from the substrate layer 402, such that the µLED 400 may be picked and placed onto a display substrate or an intermediate carrier substrate. During LLO, one or more lasers 408 are projected through the substrate layer 402 to the gallium semiconductor layer 404. The substrate layer 402 is substantially transparent to the lasers 408, allowing for the lasers 408 to reach the gallium semiconductor layer 404, which absorbs at least a portion of lasers 408. In some embodiments, the lasers 408 comprise a pulsed ultraviolet laser, and the substrate layer 402 comprises a sapphire substrate that is substantially transparent to the pulsed ultraviolet laser. In other embodiments, the lasers 408 are projected towards a junction of the substrate layer 402 and the gallium semiconductor layer 404, without passing through the substrate layer 402.

In some embodiments, the lasers 408 detach the gallium semiconductor layer 404 from the substrate layer 402 by ablating the surface of the gallium semiconductor layer 404, allowing the gallium semiconductor layer 404 to be removed from the substrate layer 402. For example, as illustrated in FIG. 4A, the GaN material at the surface of the gallium semiconductor layer 404 adjacent to the substrate layer 402, upon exposure to the lasers 408, breaks down into its component nitrogen and gallium elements. The nitrogen may be released as nitrogen gas 410, leaving behind a layer of gallium 412. In embodiments where the gallium semiconductor layer 404 is formed of a different gallium compound (e.g., GaAs or GaP), different elements may be released from the gallium semiconductor layer 404 to form the gallium layer 412. For example, in embodiments where the gallium semiconductor layer 404 comprises GaAs, the LLO process separates the GaAs at the surface of the gallium semiconductor layer 404 into gallium metal and an arsenic compound. The arsenic compound that is separated from the gallium metal as a result of the LLO process is removed to leave behind the gallium layer 412.

In some embodiments, the µLED 400 is attached to a carrier substrate (not shown) prior to being detached from the substrate layer 402. The carrier substrate may be attached to a surface of the µLED 400 opposite from the substrate layer 402 (e.g., via the electrodes 406). In some embodiments, the carrier substrate is used to hold an array of LED dies (comprising the µLED 400) to be singulated and picked and placed onto a display substrate or intermediate carrier substrate.

FIG. 4B illustrates the µLED 400 after it has been detached from the substrate layer 402. The layer of gallium 412 is formed on the surface of the gallium semiconductor layer 404 (comprising GaN) that was formerly adjacent to the substrate layer 402. Typically, the layer of gallium 412 is undesirable, and needs to be removed from the gallium semiconductor layer 404 before the µLED 400 can be operated.

Pick and Place Operation

Once the µLED has been detached from the substrate layer, the µLED can be placed onto a display substrate or a carrier substrate using a pick and place method. In some embodiments, a fluidic material is used to attach a head of a pick-up tool to the μLED. For example, the fluidic material may form a fluidic membrane that provides a surface tension or attractive force (e.g., by covalent or Van der Wall attractive forces, or other such attractive forces) that is used to pick up the μLED using the pick-up tool.

In some embodiments, the existing gallium layer formed on the surface of the gallium semiconductor layer can be leveraged for connecting the μLED to the head of the pick-up tool, eliminating the need for a separate fluidic material or the additional apparatuses needed for depositing a separate fluidic material onto the μLED and/or the head of the pick-up tool. Because gallium is solid at room temperature but has a low melting point (about 30° C.), the gallium layer can be melted and re-solidified to attach and detach the gallium semiconductor layer of the μLED to the head of the pick-up tool, with minimal risk of damaging the μLED or the pick-up tool head.

Figure 5B:
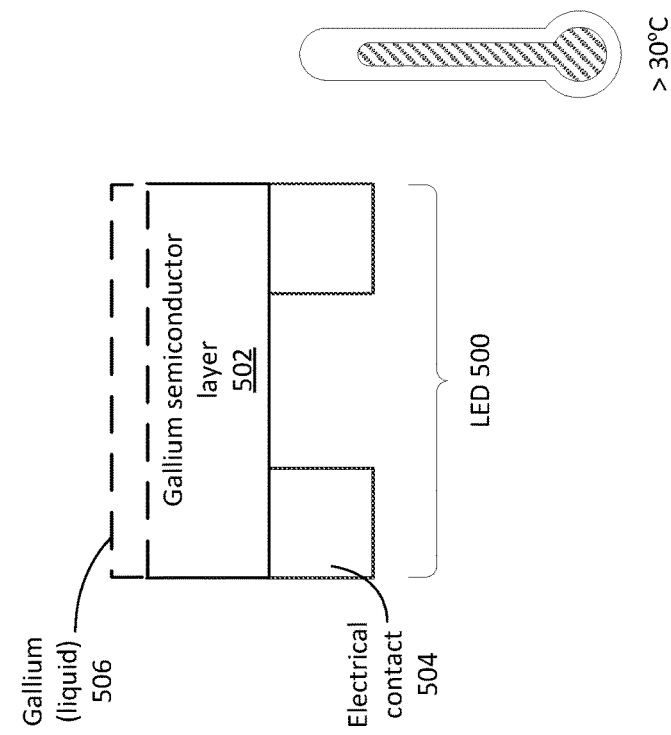
Figure 5A:
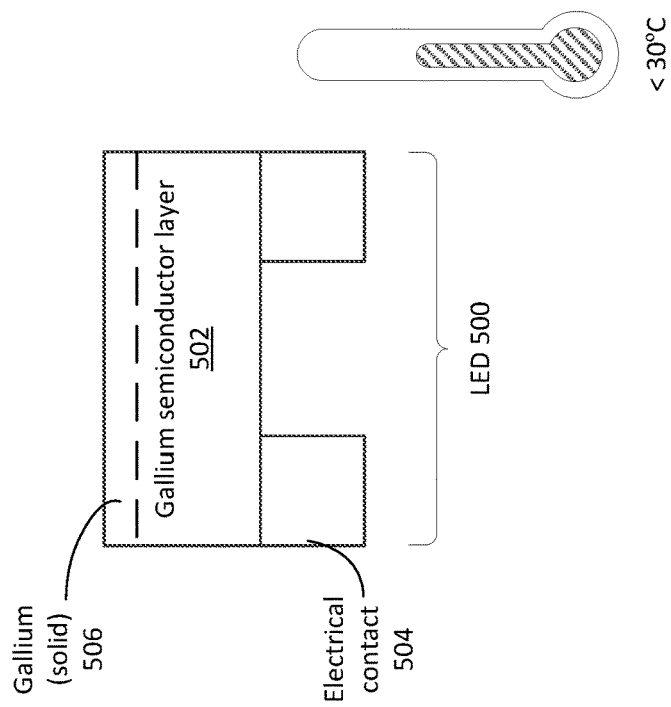

FIGS. 5A-5G illustrate diagrams of a process for picking and placing a μLED using metallic gallium, in accordance with some embodiments. In FIG. 5A, the μLED 500 has been detached from a substrate layer (e.g., a sapphire substrate) using a LLO process. The μLED 500 comprises a gallium semiconductor layer 502 and a pair of electrical contacts 504. In addition, due to the LLO process separating the elements of the gallium semiconductor substrate 502, a gallium layer 506 is formed on a surface of the gallium semiconductor layer 502.

The temperature of the μLED 500 may be changed at various points over the pick and place process to change the state of the gallium layer 506. The temperature of the μLED 500 may be controlled by a controller (e.g., the controller 106 illustrated in FIG. 1). As illustrated in FIG. 5A, the μLED 500 may initially be at a temperature below the melting point of gallium (e.g., <30° C.), such as room temperature, resulting in the gallium layer 506 being in a solid state.

In FIG. 5B, the temperature of the μLED 500 is raised to a point above the melting point of gallium (e.g., >30° C.). As such, the gallium layer 506 on the μLED 500 melts to form a liquid gallium layer. In FIG. 5C, a pick-up head 510 of a pick-up tool is aligned with the μLED 500, and moved such that a surface of the pick-up head 510 contacts the liquid gallium layer 506. In FIG. 5D, the temperature of the μLED 500 is lowered to below the melting point of gallium, such that the gallium layer 506 solidifies back into a solid material. While the gallium layer 506 is solid, the pick-up head 510 is bonded to the μLED 500, allowing the pick-up head 510 to pick up and move the μLED 500.

In FIG. 5E, the pick-up head 510 picks up the μLED 500 and places the μLED 500 onto a target substrate 512. The target substrate 512 may correspond to the target substrate 118 illustrated in FIG. 1. In some embodiments, the target substrate 512 may be a display substrate of a μLED display device. In other embodiments, the target substrate 512 may be an intermediate carrier substrate. During the pick and place process, the temperature of the μLED 500 may be kept below the melting point of gallium, such that the μLED 500 remains attached to the pick-up head 510. In some embodiments, the μLED 500 is bonded to the target substrate 512 via the pair of electrical contacts 504. For example, where the target substrate 512 is a display substrate, the electrical contacts 504 may be bonded to form electrical connections with the display substrate (e.g., to form a thin film transistor, or TFT layer).

In FIG. 5F, the temperature of the μLED 500 is raised to above the melting point of gallium, causing the gallium layer 506 to melt. As the gallium layer 506 liquefies, the pick-up head 510 is able to be lifted and separated from the μLED 500, leaving the μLED 500 on the target substrate 512.

Figure 5G:
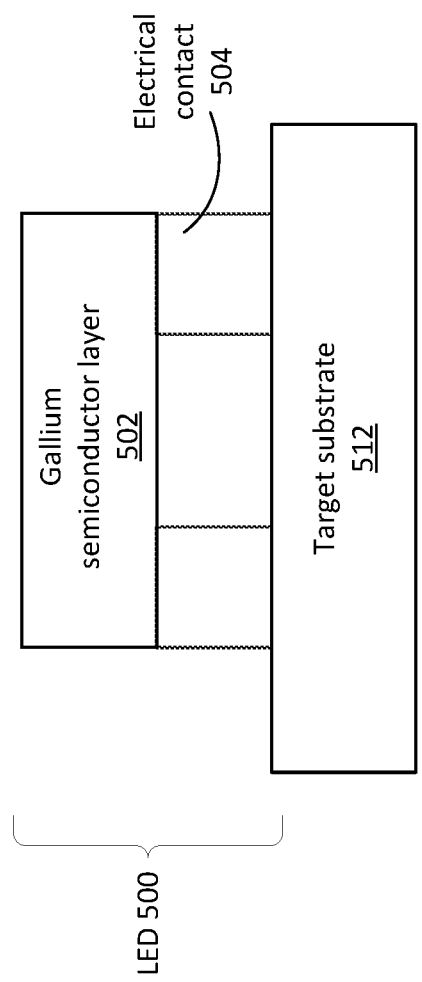

In some embodiments, if the target substrate 512 is an intermediate carrier substrate, the gallium layer 506 may be kept on the μLED 500, for use in additional pick and place procedures. On the other hand, if the target substrate 512 is a display substrate, then the gallium layer 506 may be removed in order to allow the μLED 500 to operate. FIG. 5G illustrates the μLED 500 after placement on the target substrate 512 corresponding to a display substrate. The gallium layer 506 of the μLED 500 has been removed, allowing for operation of the μLED 500. In some embodiments, the gallium layer 506 is cleaned off of the μLED 500 while still in a liquid state. In some embodiments, the gallium layer 506 is etched off of the μLED 500 using hydrochloric acid (HCl) or another type of etching agent.

Figure 6:
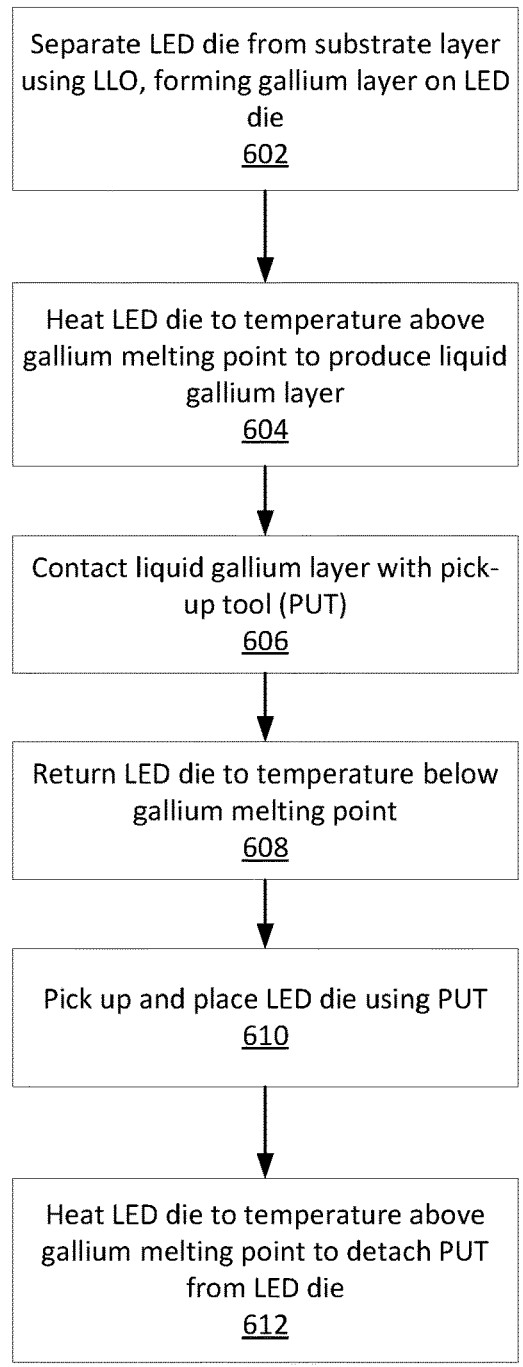
FIG. 6 is a flowchart of a process for picking and placing a μLED using the gallium layer of the μLED, in accordance with some embodiments.

FIG. 6 is a flowchart of a process for picking and placing a μLED using the gallium layer of the μLED, in accordance with some embodiments. An LED die containing a gallium semiconductor layer is separated 602 from a substrate layer using an LLO process, the LLO process causing the formation of a gallium layer on a surface of the LED die. In some embodiments, the substrate layer is a sapphire substrate that is substantially transparent to an ultraviolet laser used during the LLO process. The laser is at least partially absorbed by the gallium semiconductor layer of the LED die, which comprises a gallium compound such as GaN or GaAs, causing a portion of the gallium semiconductor layer to separate into its component elements (e.g., gallium metal and nitrogen gas, gallium metal and an arsenic compound, etc.) and weakening the bond between gallium semiconductor layer and the substrate layer. As the gaseous portion of the gallium semiconductor layer dissipates, a gallium metal layer is left behind on the surface of the LED die. In some embodiments, different types of laser may be used for LLO, based upon the type of LED. For example, while an ultraviolet laser can be used for LLO for LEDs having a GaN semiconductor layer formed on a sapphire substrate, an infrared (IR) laser may be used for LLO for LEDs formed on a GaAs substrate.

The LED die is heated 604 to a temperature above the melting point of gallium (e.g., >30° C.), such that the gallium layer formed on the LED die enters a liquid state. In some embodiments, the LED die is heated using a controller that controls a temperature of a chamber that the LED is located in. In other embodiments, heat may be directly applied to the LED die to heat the LED die to the desired temperature.

A pick-up head of a pick-up tool is positioned 606 to contact the liquid gallium layer of the LED die. The pick-up head may correspond to one or a plurality of pick-up heads of a pick-up array. In some embodiments, the pick-up head comprises a substantially flat surface having an area similar to that of a surface of the LED die.

The LED die is cooled 608 to a temperature below the melting point of gallium (<30° C.), such that the gallium layer on the surface of the LED die solidifies and bonds the LED die to the pick-up head contacting the gallium layer. The pick-up tool picks up and places 610 the LED die onto a desired location of a target substrate. In some embodiments, the target substrate is an intermediate substrate, while in other embodiments, the target substrate may be a display substrate. In some embodiments, the electrical contacts of the LED die are bonded to the target substrate to form one or more electrical connections.

The LED die is heated 612 to a temperature above the melting point of gallium, such that the gallium layer of the LED ties returns to a liquid state, allowing for the pick-up head of the pick-up tool to be detached from the LED die. In some embodiments, the gallium layer may then be removed from the surface of LED die (e.g., if the target substrate is a display substrate). On the other hand, if the target substrate is not a display substrate, the gallium layer may be temporarily kept on the surface of the LED die (e.g., for use in attaching to a pick-up head of the pick-up tool for additional pick and place operations), and only removed until after the LED die has been placed on its final location on a display substrate. In some embodiments, the gallium layer on the LED die is removed while the gallium layer is in a liquid state. In other embodiments, the gallium layer may be cooled such that it returns to a solid state, and removed using an etching process.

By using the existing gallium layer that is formed as a natural consequence of performing LLO process on an LED die to separate the substrate layer and gallium semiconductor layer formed on the substrate layer, the process of picking and placing the LED dies using a pick-up tool is improved in terms of manufacturing efficiency, costs, and throughput. For example, there is no need to clean the gallium material that exists after the LLO process, or to attach an adhesive material onto the LEDs dies facilitate attachment with the pick-up tool. Instead, the pick-up head of the pick-up tool can be easily attached or detached from the LED die by raising and lowering the temperature of the LED die (e.g., between room temperature and above 30° C.) to change the state of the existing gallium layer between solid and liquid states. Because of the low melting point of the gallium metal, this state transition can be accomplished without risk of damaging the LED die or the pick-up tool due to exposure to high heat. The solidified gallium may provide a strong bond between the LED die and the pick-up head, improving the ability of the pick-up tool to pick and place the LED die.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method, comprising:
    forming an array of light emitting diode (LED) dies including:
        a substrate layer; and
        a gallium semiconductor layer formed on a surface of the substrate layer;
    exposing the gallium semiconductor layer to a laser to detach the gallium semiconductor layer from the substrate layer, the laser being absorbed by a portion of the gallium semiconductor layer to form gallium material on each of the LED dies of the array;
    separating the substrate layer from the gallium semiconductor layer to expose a surface of the gallium semiconductor layer and the gallium material on the surface;
    heating the gallium material on at least a subset of the LED dies to form liquid gallium on the surface of the gallium semiconductor layer of the at least a subset of the LED dies;
    contacting the liquid gallium of the at least a subset of the LED dies with a pick-up tool (PUT);
    cooling the liquid gallium into solid gallium to attach the PUT with the at least a subset of the LED dies via the solid gallium;
    picking up the at least a subset of the LED dies using the PUT.

2. The method of claim 1, further comprising:
    placing the at least a subset of the LED dies on a target substrate using the PUT;
    heating the solid gallium attaching the PUT with the at least a subset of LED dies to detach the PUT from the at least a subset of the LED dies.

3. The method of claim 2, wherein the target substrate comprises a device substrate including control circuits for the LED dies.

4. The method of claim 2, further comprising removing gallium that remains on the at least a subset of the LED dies subsequent to detaching the PUT from the at least a subset of LED dies.

5. The method of claim 4, wherein removing the gallium that remains on the at least a subset of the LED dies includes etching the gallium with an etchant.

6. The method of claim 1, wherein the gallium semiconductor layer includes gallium nitride (GaN).

7. The method of claim 6, wherein the laser being absorbed by the portion of the gallium semiconductor layer to form gallium material separates the portion of the gallium semiconductor layer into the gallium material and nitrogen gas.

8. The method of claim 1, wherein the gallium semiconductor layer includes gallium arsenide (GaAs).

9. The method of claim 8, wherein the laser being absorbed by the portion of the gallium semiconductor layer to form gallium material separates the portion of the gallium semiconductor layer into the gallium material and an arsenic compound.

10. The method of claim 1, wherein exposing the gallium semiconductor layer to the laser comprises projecting the laser through the substrate layer to the gallium semiconductor layer, wherein the laser is a pulsed ultraviolet laser, and the substrate layer comprises a sapphire substrate that is substantially transparent to the pulsed ultraviolet laser.

11. The method of claim 1, wherein the laser being absorbed by a portion of the gallium semiconductor layer weakens bonding between the gallium semiconductor layer and the substrate layer to detach the substrate layer and the gallium semiconductor layer.

12. The method of claim 1, further comprising:
    prior to exposing the gallium semiconductor layer to the laser to detach the gallium semiconductor layer from the substrate layer, attaching the array of LEDS to a carrier substrate, the gallium semiconductor layer being positioned between the substrate layer and the carrier substrate; and
    wherein picking up the at least a subset of the LED dies using the PUT comprises picking up the at least a subset of the LED dies from the carrier substrate.

* * * * *